United States Patent
Chen

(10) Patent No.: US 10,534,214 B2
(45) Date of Patent: Jan. 14, 2020

(54) DISPLAY PANEL AND MASK FOR MANUFACTURING PROCESS OF DISPLAY PANEL

(71) Applicants: HKC Corporation Limited, Shenzhen (CN); Chongqing HKC Optoelectronics Technology Co., ltd., Chongqing (CN)

(72) Inventor: Wei Chen, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 145 days.

(21) Appl. No.: 15/848,572

(22) Filed: Dec. 20, 2017

(65) Prior Publication Data

US 2018/0284533 A1    Oct. 4, 2018

Related U.S. Application Data

(63) Continuation of application No. PCT/CN2017/089183, filed on Jun. 20, 2017.

(30) Foreign Application Priority Data

Mar. 30, 2017    (CN) .......................... 2017 1 0201915

(51) Int. Cl.
*G02F 1/1335*   (2006.01)
*G03F 1/20*   (2012.01)
*G02F 1/1362*   (2006.01)

(52) U.S. Cl.
CPC .......... *G02F 1/133514* (2013.01); *G03F 1/20* (2013.01); *G02F 1/136286* (2013.01)

(58) Field of Classification Search
CPC .......................... G02F 1/1335; G02F 2201/52
USPC .... 349/83, 84, 106, 108, 129; 345/694, 695, 345/43, 55
See application file for complete search history.

(56) References Cited

U.S. PATENT DOCUMENTS

| | | | | |
|---|---|---|---|---|
| 6,046,541 A * | 4/2000 | Valliath | ................. | H01J 29/864 313/258 |
| 7,656,488 B2 * | 2/2010 | Kazuyoshi | ........ | G02F 1/133707 349/106 |
| 2005/0237449 A1 * | 10/2005 | Wu | ................... | G02F 1/133514 349/106 |
| 2007/0046867 A1 * | 3/2007 | Yang | ................. | G02F 1/133514 349/106 |
| 2016/0104413 A1 * | 4/2016 | Matsueda | ........... | H01L 27/3218 345/694 |

* cited by examiner

*Primary Examiner* — Audrey Y Chang
(74) *Attorney, Agent, or Firm* — WPAT, PC

(57) ABSTRACT

A display panel and a mask for a manufacturing process of a display panel are provided. The display panel includes scan lines and data lines; the numerous data lines and the numerous scan lines are disposed to be intersected to form multiple pixel regions; each of the pixel regions is disposed with a pixel structure correspondingly. The pixel structure includes a pixel. Edges of the pixel at least include an arc section.

12 Claims, 7 Drawing Sheets

DISPLAY PANEL AND MASK FOR MANUFACTURING PROCESS OF DISPLAY PANEL

FIELD OF THE DISCLOSURE

The disclosure relates to a display technical field, and more particularly to a display panel and a mask for a manufacturing process of a display panel.

BACKGROUND

Liquid crystal displays are widely applied due to numerous advantages such as thin bodies, energy saving, radiation-free, etc. Most liquid crystal displays available on the market are backlight-type liquid crystal displays, and such liquid crystal display includes a liquid crystal panel and a backlight module. The working principle of the liquid crystal panel is placing liquid crystal molecules between two parallel glass substrates and applying a driving voltage on the two glass substrates to control rotation directions of the liquid crystal molecules, for refracting rays from the backlight module to generate images.

A thin film transistor-liquid crystal display (TFT-LCD) gradually occupies the dominant position in the display realm at present because of its properties such as low energy consumption, superior image quality and relatively high production yield, etc. Identically, the TFT-LCD includes a liquid crystal panel and a backlight module. The liquid crystal panel includes a color filter (CF) substrate, a thin film transistor (TFT) array substrate and a mask. The opposite internal sides of the substrates have transparent electrodes. A layer of liquid crystal (LC) molecules is interposed between the two substrates.

The conventional pixel design adopts a rectangle with sharp angles. The serration around the displayed word can be seen by eyes and the display effect is degraded. The poor images can hardly satisfy the developing requirement on displayed images of customers.

SUMMARY

A technical problem will be solved by the disclosure is to provide a display panel capable of improving image smoothness.

Furthermore, the disclosure further provides a display device.

Furthermore, the disclosure further provides a mask for a manufacturing process of a display panel.

The objective of the disclosure is achieved by following embodiments. A display panel includes scan lines and data lines.

The data lines are disposed intersecting with the scan lines to form a plurality of pixel regions; each of the pixel regions is disposed with a pixel structure correspondingly. The pixel structure includes a pixel. Edges of the pixel at least include an arc section.

Each pixel includes subpixels corresponding to different colors. The subpixels can include subpixels corresponding to colors such as white (W), yellow (Y) besides RGB. The colors are more diverse and the display effect is also better.

Each of the subpixels includes at least two unit pixels. A shape of the unit pixel is round. The at least two unit pixels and the round unit pixels specify structural properties of the subpixels. The amount of at least two is convenient for diversifying the arrangements. Round is a conventional shape in processing for reducing costs.

The adjacent two unit pixels are externally-tangent. The externally-tangent arrangement makes the unit pixels closed to better ensure the smoothness of images.

The subpixels include three unit pixels. An included angle between a line connecting a center of circle of the unit pixel on one end with a center of circle of the unit pixel in the middle and a line connecting a center of circle of the unit pixel on the other end with the center of the circle of the unit pixel in the middle is 120°. The specific arrangement of the unit pixels in the subpixels is clarified. The three unit pixels corresponding to the subpixels are arranged as a fold line with a certain angle. The three unit pixels and those in adjacent subpixels are externally-tangent to maximize the area of subpixels for improving image display.

The subpixel is the polygon with arc corners, elliptic or round. When the subpixel is the polygon with arc corners, the smooth arc can prevent the serration brought by sharp angles. The ellipse is simple in the structure and convenient for the process. The round is a conventional shape in processing for reducing costs.

The scan lines and the data lines match a contour curve of the pixel. The scan lines and the data lines match the contour curve of the pixel to ensure the proper operation of the pixel electrode after the pixels are arced, so that the display panel can show smooth images.

The pixel structure is disposed on a pixel film layer. The display panel includes a color filter substrate and an array substrate. The pixel structure includes a color filter film located at the color filter substrate. Edges of the pixel at least include an arc section. The corresponding disposition of the color film filter is benefit for the better performance of the pixel structure.

According to another aspect of the disclosure, the disclosure further discloses a display device. The display device includes a backlight module and the display panel described above.

According to another aspect of the disclosure, the disclosure further discloses a mask for a manufacturing process of a display panel. The mask includes a light-transmissive hole with a corresponding shape defined in a position of the pixel structure of any one of the display panels described above.

The pixels are altered from the original rectangle to one with at least an arc section. The method of optimizing the shape of pixels significantly reduces the serration around a word to make the displayed image smoother. The panel displays better and users can achieve better views, simultaneously reducing costs and enhancing the competitive strength of the product.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the drawings.

DETAILED DESCRIPTION OF PREFERRED EMBODIMENTS

Figure 1:
FIG. 1 are displayed compared images before and after smoothness enhancement.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, it should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "include" and/or "contain" define the existence of described features, integers, steps, operations, units and/or components, but do not exclude the existence or addition of one or more other features, integers, steps, operations, units, components and/or combinations thereof.

The disclosure will be further described with reference to accompanying drawings and preferred embodiments as follows.

Figure 2:
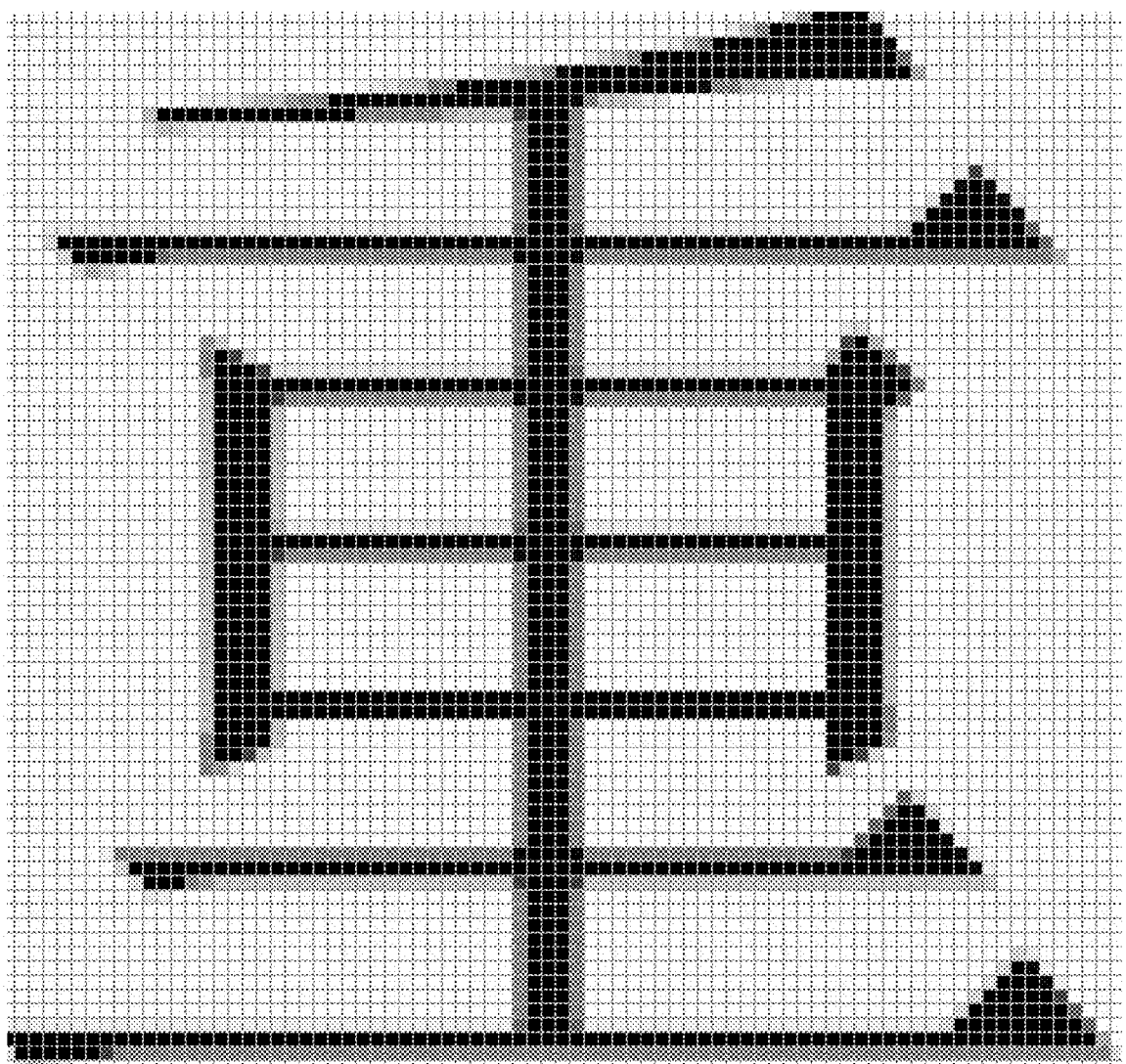
FIG. 2 is a schematic display view of rectangular pixels.

The pixel structure of the display panel of embodiments of the disclosure will be illustrated with reference to FIG. 1 to FIG. 7. The display panel includes an array substrate and a color filter substrate. The array substrate and the color filter substrate are disposed opposite. The pixel structure serves for aspects such as the color performance of the display panel. As shown in FIG. 2, the pixels are rectangles and the serration around the displayed word can be seen. Users cannot achieve a display effect with the superior serration. The applicant thereby provides to improve the serration by the super resolution algorithm. According to the algorithm, the contrast effect shown in FIG. 1 can be obtained, but the cost of chips will be increased accordingly. The applicant further provides to improve the serration of images by the design of panels with high resolution, but the panels of ultra high definition (UHD) are too pricy to be economic in display realms such as TV, monitors, notebook, etc. Therefore, the applicant designs a pixel structure for improving image serration according to the problem above.

Figure 3:
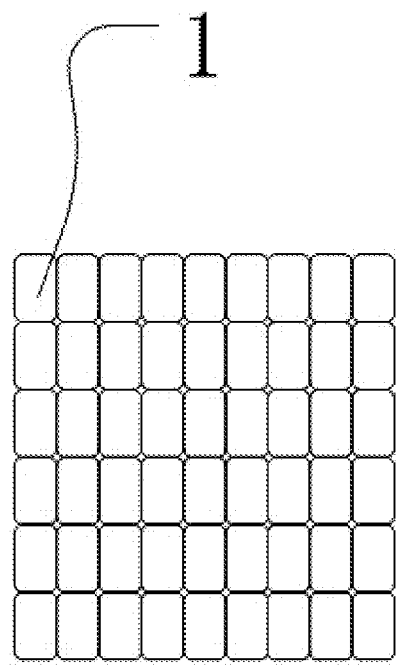
FIG. 3 is a schematic view showing a pixel structure of a display panel according to an embodiment of the disclosure.

FIG. 3 shows a schematic view of a pixel structure of a display panel according to an embodiment of the disclosure. The pixel structure of the embodiment includes a pixel 1. Edges of the pixel 1 at least include an arc section. The pixel 1 is altered from the original rectangle to one with at least an arc section. The method of optimizing the shape of pixels significantly reduces the serration around a word to make the displayed image smoother. The display effect is improved to make the panel to display better, and users can achieve better views, simultaneously reducing costs and enhancing the competitive strength of the product. The multiple pixels 1 are arranged as an array. Each of the pixels 1 can be the rectangle with four arc corners. The size of the pixels are the same. The pixels 1 are arranged the same way as the manner applied to the rectangular ones with neat rows and columns.

Specifically, each of the pixels includes subpixels corresponding to different colors. The subpixels can include subpixels corresponding to colors such as white (W), yellow (Y) other than R subpixels 2, G subpixels 3 and B subpixels 4. The colors are more diverse and the display effect is also better.

As another embodiment of the disclosure, the subpixels are polygons with arc corners, elliptic or round. When the subpixels are polygons with arc corners, the smooth arc can prevent the serration brought by sharp angles. The ellipse is simple in the structure and convenient for the process. The round is a conventional shape in processing for reducing costs.

Figure 4:
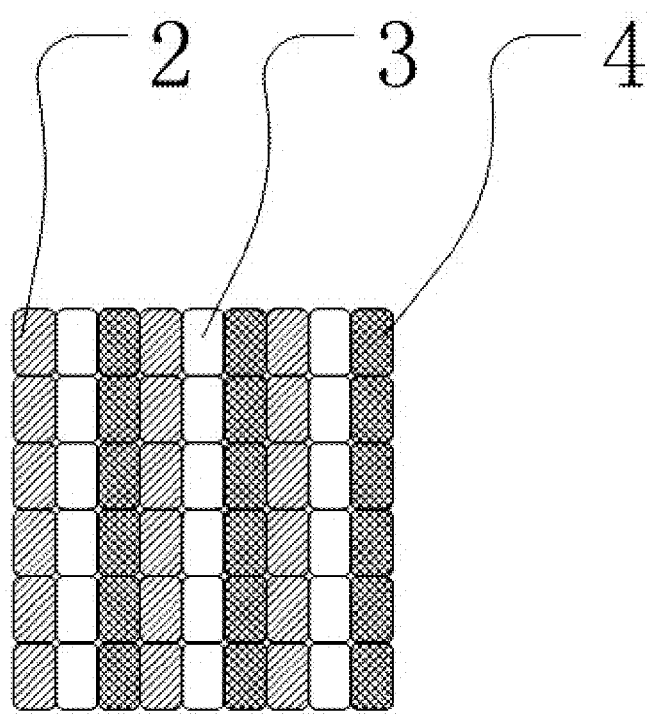
FIG. 4 is a schematic view showing a pixel structure of a display panel according to another embodiment of the disclosure.

Specifically, FIG. 4 is a schematic view of a pixel structure of a display panel according to an embodiment of the disclosure. Each of the pixels in the embodiment includes one R subpixel 2, one G subpixel 3 and one B subpixel 4 arranged along a first direction in sequence. The R subpixel 2, the G subpixel 3 and the B subpixel 4 are polygons with arc corners. The first direction is the horizontal direction in the figure/the direction of the scan lines. Correspondingly, a second direction is the vertical direction/the direction of the data lines. The R subpixel 2, the G subpixel 3 and the B subpixel 4 are arranged in the first direction in sequence. The subpixels are polygons with arc corners. The smooth arc can prevent the serration brought by sharp angles. A sequence of the R subpixel 2, the G subpixel 3, the B subpixel 4, the R subpixel 2, the G subpixel 3, the B subpixel 4 and so on is utilized in the first direction. The sequence can also be RBGRBG, BGRBGR, etc. In the second direction, each column merely includes the R subpixels 2, the G subpixels 3 or the B subpixels 4. The subpixels can include subpixels corresponding to colors such as white (W), yellow (Y) other than R subpixels 2, G subpixels 3 and B subpixels 4. The colors are more diverse and the display effect is also better. The R subpixels 2, the G subpixels 3 and the subpixels 4 can be rectangles with four arc corners. Sizes of the R subpixels 2, the G subpixels 3 and the B subpixels 4 are the same. The R subpixels 2, the G subpixels 3 and the B subpixels 4 are arranged as the manner applied to the rectangular ones with neat rows and columns. The R subpixels 2, the G subpixels 3 and the B subpixels 4 can likewise be other polygons with arc corners.

Figure 5:
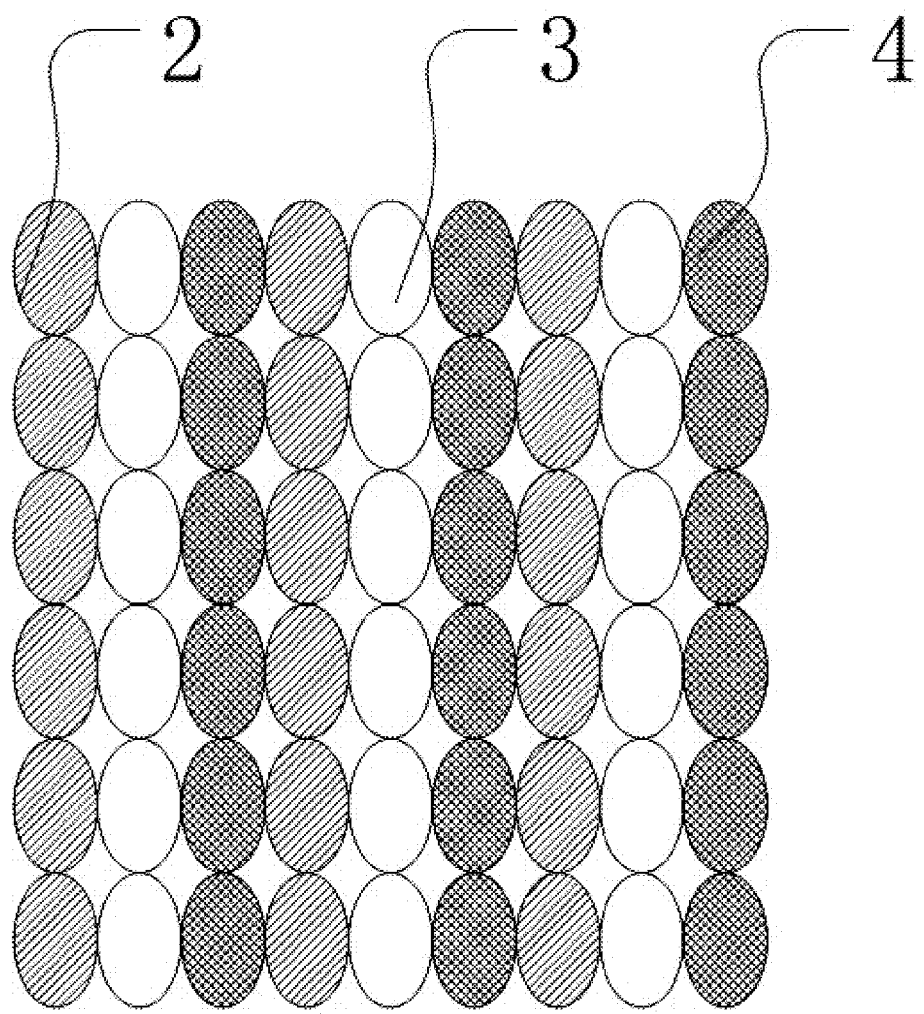
FIG. 5 is a schematic view showing a pixel structure of a display panel according to still another embodiment of the disclosure.

Specifically, FIG. 5 is a schematic view of a pixel structure of a display panel according to an embodiment of the disclosure. Each of the pixels in the embodiment includes one R subpixel 2, one G subpixel 3 and one B subpixel 4 arranged along a first direction in sequence. The R subpixel 2, the G subpixel 3 and the B subpixel 4 are elliptic. The ellipse is simple in the structure and convenient for the process. The smooth arc can prevent the serration brought by sharp angles. The first direction is the horizontal direction in the figure/the direction of the scan lines. Correspondingly, a second direction is the vertical direction/the direction of the data lines. The sequence of the R subpixel 2, the G subpixel 3, the B subpixel 4, the R subpixel 2, the G subpixel 3, the B subpixel 4 and so on is utilized in the first direction. The sequence can also be RBGRBG, BGRBGR, etc. In the second direction, each column merely includes the R subpixels 2, the G subpixels 3 or the B subpixels 4. The subpixels can include subpixels corresponding to colors such as white (W), yellow (Y) other than R subpixels 2, G subpixels 3 and B subpixels 4. The colors are more diverse and the display effect is also better. Sizes of the R subpixels 2, the G subpixels 3 and the B subpixels 4 are the same. The R subpixels 2, the G subpixels 3 and the B subpixels 4 are arranged as the manner applied to the rectangular ones with neat rows and columns.

Figure 6:
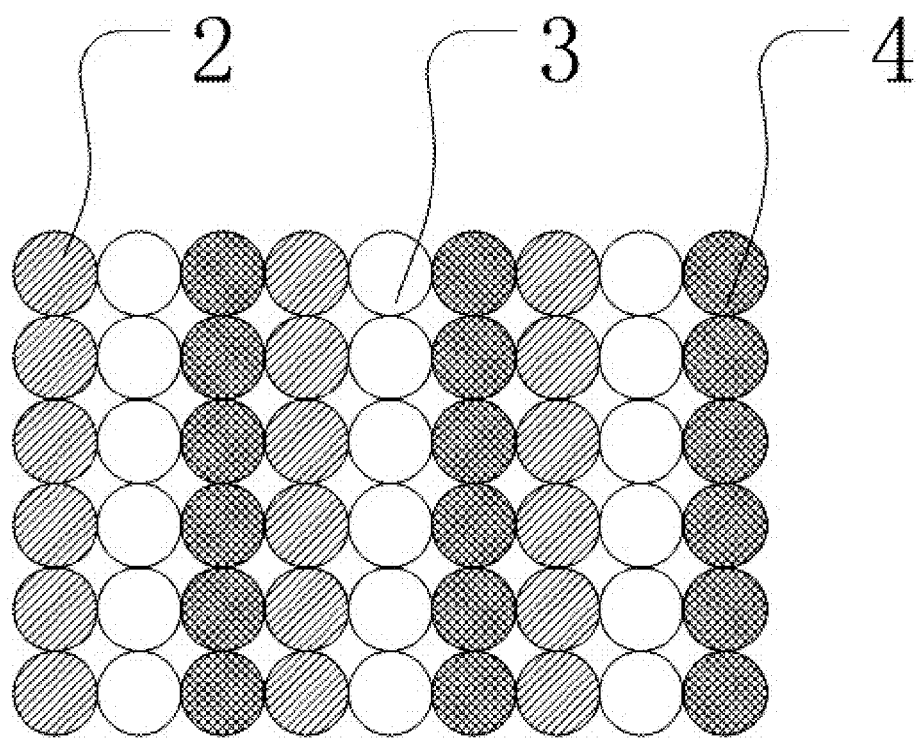
FIG. 6 is a schematic view showing a pixel structure of a display panel according to even still another embodiment of the disclosure.

Specifically, FIG. 6 is a schematic view of a pixel structure of a display panel according to an embodiment of the disclosure. Each of the pixels in the embodiment includes one R subpixel 2, one G subpixel 3 and one B subpixel 4 arranged along a first direction in sequence. The R subpixel 2, the G subpixel 3 and the B subpixel 4 are round. The round is a conventional shape in processing for reducing costs. The smooth arc can prevent the serration brought by sharp angles. The first direction is the horizontal direction in the figure/the direction of the scan lines. Correspondingly, a second direction is the vertical direction/the direction of the data lines. The sequence of the R subpixel 2, the G subpixel 3, the B subpixel 4, the R subpixel 2, the G subpixel 3, the B subpixel 4 and so on is utilized in the first direction. The sequence can also be RBGRBG, BGRBGR, etc. In the second direction, each column merely includes the R subpixels 2, the G subpixels 3 or the B subpixels 4. The subpixels can include subpixels corresponding to colors such as white (W), yellow (Y) other than R subpixels 2, G subpixels 3 and B subpixels 4. The colors are more diverse and the display effect is also better. Sizes of the R subpixels 2, the G subpixels 3 and the B subpixels 4 are the same. The R subpixels 2, the G subpixels 3 and the B subpixels 4 are arranged as the manner applied to the rectangular ones with neat rows and columns.

As another embodiment of the disclosure, each of the subpixels includes at least two unit pixels. The shape of the unit pixel is round. The at least two unit pixels and the round unit pixels specify structural properties of the subpixels. The amount of at least two is convenient for diversifying the arrangements. Round is a conventional shape in processing for reducing costs.

Specifically, the adjacent two unit pixels are externally-tangent. The externally-tangent arrangement makes the unit pixels closed to better ensure the smoothness of images.

Specifically, the subpixel includes three unit pixels. An included angle between a line connecting a center of circle of the unit pixel on one end with a center of circle of the unit pixel in the middle and a line connecting a center of circle of the unit pixel on the other end with the center of the circle of the unit pixel in the middle is 120°. The specific arrangement of the unit pixels in the subpixels is clarified. The three unit pixels corresponding to the subpixels are arranged as a fold line with a certain angle. The three unit pixels and those in adjacent subpixels are externally-tangent to maximize the area of subpixels for improving image display.

Figure 7:
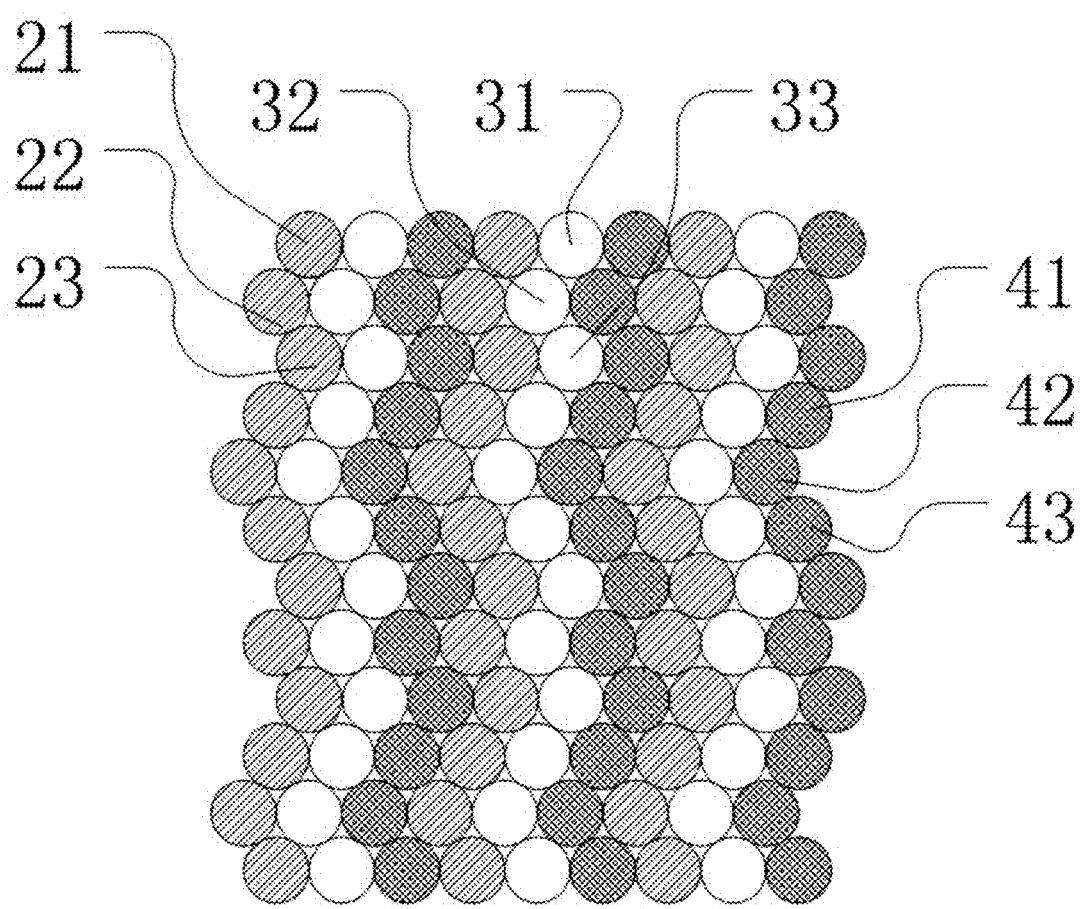
FIG. 7 is a schematic view showing a pixel structure of a display panel according to further another embodiment of the disclosure.

Specifically, FIG. 7 is a schematic view of a pixel structure of a display panel according to an embodiment of the disclosure. Each of the pixels 1 in the embodiment includes one R subpixel 2, one G subpixel 3 and one B subpixel 4 arranged along a first direction in sequence. The R subpixel 2, the G subpixel 3 and the B subpixel 4 respectively include 3 unit pixels. The unit pixels are round. The adjacent two unit pixels are externally-tangent. The R subpixel 2 includes 3R unit pixels—a first R unit pixel 21, a second R unit pixel 22 and a third R unit pixel 23. Centers of circles of the first R unit pixel 21 and the second R unit pixel 22 are on a first straight line. Centers of circles of the second R unit pixel 22 and the third R unit pixel 23 are on a second straight line. An angle between the first straight line and the second straight line is 120°. The center of the circle of the second R unit pixel 22 is located at a point of intersection of the two straight lines; the G subpixel 3 includes 3G unit pixels—a first G unit pixel 31, a second G unit pixel 32 and a third G unit pixel 33. Centers of circles of the first G unit pixel 31 and the second G unit pixel 32 are on a third straight line. Centers of circles of the second G unit pixel 32 and the third G unit pixel 33 are on a fourth straight line. An angle between the third straight line and the fourth straight line is 120°. The center of the circle of the second G unit pixel 32 is located at a point of intersection of the two straight lines; the B subpixel 4 includes 3B unit pixels—a first B unit pixel 41, a second B unit pixel 42 and a third B unit pixel 43. Centers of circles of the first B unit pixel 41 and the second B unit pixel 42 are on a fifth straight line. Centers of circles of the second B unit pixel 42 and the third B unit pixel 43 are on a sixth straight line. An angle between the fifth straight line and the sixth straight line is 120°. The center of the circle of the second B unit pixel 42 is located at a point of intersection of the two straight lines; the first R unit pixel 21, the first G unit pixel 31 and the first B unit pixel 41 are arranged along the first direction as an identical straight line in sequence. The second R unit pixel 22, the second G unit pixel 32 and the second B unit pixel 42 are arranged along the first direction as an identical straight line in sequence. The third R unit pixel 23, the third G unit pixel 33 and the third B unit pixel 43 are arranged along the first direction as an identical straight line in sequence. The specific arrangement of the unit pixels of the 3 unit pixels corresponding to the subpixel in a fold line can maximize the area of the R subpixels 2, the G subpixels 3 and the B subpixels 4 for improving image display. The first straight line, the third straight line and the fifth straight line are parallel. The second straight line, the fourth straight line and the sixth straight line are parallel.

Three unit pixels form the subpixel. The first direction is the horizontal direction in the figure. Correspondingly, the second direction is the vertical direction. The sequence of the R subpixel 2, the G subpixel 3, the B subpixel 4, the R subpixel 2, the G subpixel 3, the B subpixel 4 and so on is utilized in the first direction. The sequence can also be RBGRBG, BGRBGR, etc. In the second direction, each column merely includes the R subpixels 2, the G subpixels 3 or the B subpixels 4. The subpixels can include subpixels corresponding to colors such as white (W), yellow (Y) other than R subpixels 2, G subpixels 3 and B subpixels 4. The colors are more diverse and the display effect is also better. The R subpixels 2, the G subpixels 3 and the subpixels 4 can be rectangles with four arc corners. Sizes of the R subpixels 2, the G subpixels 3 and the B subpixels 4 are the same. In order to guarantee the serration of images, the adjacent two unit pixels are externally-tangent. In other words, the sections among the unit pixels shown in FIG. 7 are formed by three externally-tangent circles, rather than the sections among the unit pixels shown in FIG. 6 formed by four externally-tangent circles. As a result, adjacent two lines of subpixels as shown in FIG. 7 are not in one straight line along the second direction. The subpixels respective in the adjacent two lines are staggered, but the subpixels in other lines are in a straight line along the second direction.

As another embodiment of the disclosure, the embodiment includes a display panel containing a pixel structure. The display panel includes scan lines 5 and data lines 6. The multiple scan lines 5 and the multiple data lines 6 are disposed to be intersected to form numerous pixel regions. Each of the pixel regions is disposed with the pixel structure correspondingly. The disposed to be intersected to form a plurality of pixel regions; each of the pixel regions being disposed with a pixel structure correspondingly. The specific structure and the connection of the pixel structure can be referred to FIG. 3 to FIG. 7 without repeated description in detail.

Specifically, the pixel structure is disposed on a pixel film layer. The display panel includes a color filter substrate and an array substrate. The pixel structure includes a color filter film located at the color filter substrate. Edges of the pixel at least include an arc section. The corresponding disposition of the color film filter is benefit for the better performance of the pixel structure. Or the pixel structure is located at a pixel electrode of the array substrate. Positions of the pixel electrode and the color filter film are opposite. Edges of the pixel electrode at least include an arc section.

Specifically, the pixel structure is disposed on the pixel film layer. Margins of the pixel film layer are disposed to be shade light. The light shaded disposition can assure the release of vacancies caused in the edges due to the pixel arcing.

As another embodiment of the disclosure, the scan lines 5 and the data lines 6 match a contour curve of the pixel 1. The scan lines and the data lines match the contour curve of the pixel to ensure the proper operation of the pixel electrode after the pixels are arced, so that the display panel can show smooth images. With respect to the embodiments of the pixel structure as shown in FIG. 3 to FIG. 6, the pixels 1 are arranged with neat rows and columns. The scan lines 5 and the data lines 6 are correspondingly disposed in vacancies among rows and columns. The first direction is the horizontal direction in the figure identical to the direction of the scan lines 5. Correspondingly, the second direction is the vertical direction identical to the direction of the data lines 6.

Figure 8:
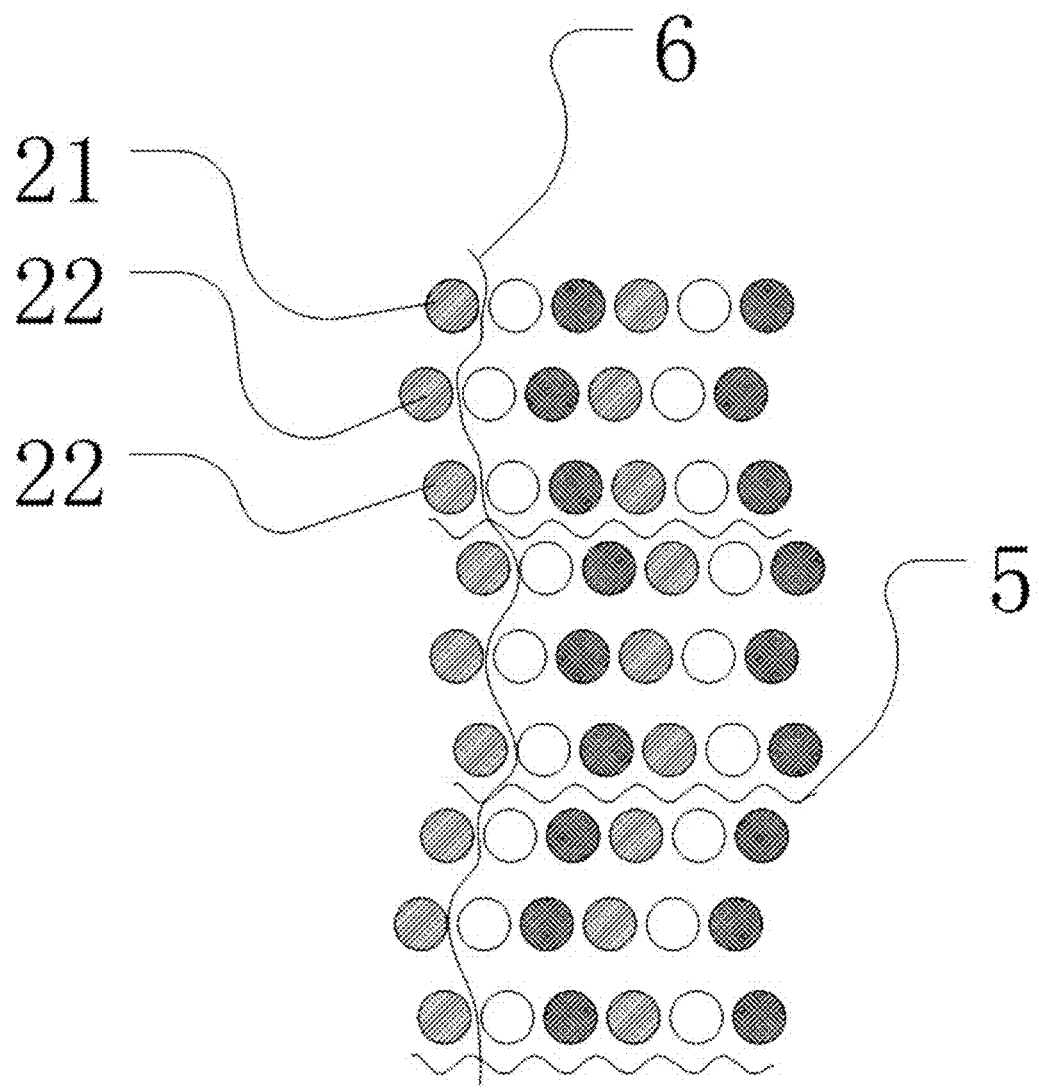
FIG. 8 is a schematic view showing a scan line and a data line of a display panel according to an embodiment of the disclosure.

Specifically, FIG. 8 is a schematic view of a scan line 5 and a data line 6 of a display panel according to an embodiment of the disclosure corresponding to the embodiment of the pixel structure shown in FIG. 7. As the subpixels or even the unit pixels are not arranged as the rows perpendicular to the columns, the corresponding disposition of the scan lines 5 and the data lines 6 matching a contour curve of the pixel 1 can be better in achieving the superior display panel with the pixel structure.

As another embodiment of the disclosure, the embodiment discloses a mask for a manufacturing process of a display panel. The mask includes a light-transmissive hole with a corresponding shape defined in a position of the pixel structure. The specific structure and the connection of the pixel structure can be referred to FIG. 3 to FIG. 7 without repeated description in detail. The mask can be configured to expose and develop during the color filter substrate processing three primary colors R/G/B. Therefore, different masks are required to achieve the exposure after coating each R/G/B photoresist. The mask includes a filter layer, a light blocking layer and a carrier. The light blocking layer includes several light blocks. The light blocks are disposed to be spaced apart. The positions of the light-transmissive holes are among the light blocks; the carrier can be disposed to be transparent. The filter layer and the light blocking layer are disposed on the carrier.

In the embodiments above, the material of the substrate can be glass, plastic, etc.

In the embodiments above, the display panel includes a liquid crystal panel, an organic light-emitting diode (OLED) panel, a curved panel, a plasma panel, etc. Taking the liquid crystal panel as an example, the liquid crystal panel includes a thin film transistor (TFT) substrate and a color filter (CF) substrate. The array substrate and the color filter substrate are disposed opposite. The liquid crystal and a photo spacer (PS) are disposed between the array substrate and the CF substrate. The array substrate is disposed with an active switch. The active switch can adopt the thin film transistor (TFT). The CF substrate is disposed with a color filter layer.

In the embodiment above, the CF substrate can include the TFT array. The color film and the TFT array can be formed on the same substrate. The array substrate can include the color filter layer.

In the embodiment above, the display panel of the disclosure can be a curved panel.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:
1. A display panel, comprising:
   scan lines; and
   data lines;
   wherein the data lines are disposed intersecting with the scan lines to form a plurality of pixel regions; each of the pixel regions is correspondingly disposed with a pixel structure, the pixel structure comprises a pixel, and edges of the pixel at least comprise an arc section;
   wherein each of the pixels comprises sub-pixels corresponding to different colors; each of the subpixels comprises three unit pixels, the subpixel is polygonal with arc corners, elliptic or round, and a shape of the unit pixel is round; adjacent two unit pixels are externally-tangent; an included angle between a line connecting a center of circle of the unit pixel on one end with a center of circle of the unit pixel in the middle and a line connecting a center of circle of the unit pixel on the other end with the center of circle of the unit pixel in the middle is 120°; the scan lines and the data lines are matched with a contour curve of the pixel; the display panel comprises a color filter substrate and an array substrate, the pixel structure comprises a color filter film located at the color filter substrate, and edges of the color filter film at least comprise an arc section.

2. A display panel, comprising:

scan lines; and data lines;

wherein the data lines are disposed intersecting with the scan lines to form a plurality of pixel regions; each of the pixel regions is correspondingly disposed with a pixel structure, the pixel structure comprises a pixel, and edges of the pixel at least comprise an arc section;

wherein each of the pixels comprises sub-pixels corresponding to different colors; each of the subpixels comprises three unit pixels, an included angle between a line connecting a center of circle of the unit pixel on one end with a center of circle of the unit pixel in the middle and a line connecting a center of circle of the unit pixel on the other end with the center of circle of the unit pixel in the middle is 120°.

3. The display panel according to claim 2, wherein a shape of the unit pixel is round.

4. The display panel according to claim 3, wherein adjacent two unit pixels are externally-tangent.

5. The display panel according to claim 2, wherein a shape of the unit pixel is round; adjacent two unit pixels are externally-tangent.

6. The display panel according to claim 2, wherein the subpixel is polygonal with arc corners, elliptic or round.

7. The display panel according to claim 2, wherein the scan lines and the data lines are matched with a contour curve of the pixel.

8. The display panel according to claim 2, wherein the display panel comprises a color filter substrate and an array substrate, the pixel structure comprises a color filter film located at the color filter substrate, edges of the color filter film at least comprise an arc section.

9. The display panel according to claim 2, wherein the subpixel is polygonal with arc corners, elliptic or round, and a shape of the unit pixel is round; adjacent two unit pixels are externally-tangent; the scan lines and the data lines are matched with a contour curve of the pixel; the display panel comprises a color filter substrate and an array substrate, the pixel structure comprises a color filter film located at the color filter substrate, and edges of the color filter film at least comprise an arc section.

10. A mask adapted for a manufacturing process of a display panel, the display panel comprising:

scan lines; and data lines;

wherein the data lines are disposed intersecting with the scan lines to form a plurality of pixel regions;

each of the pixel regions is correspondingly disposed with a pixel structure, the pixel structure comprises a pixel, edges of the pixel at least comprise an arc section;

each pixel comprises subpixels corresponding to different colors; each of the subpixels comprises three unit pixels;

an included angle between a line connecting a center of circle of the unit pixel on one end with a center of circle of the unit pixel in the middle and a line connecting a center of circle of the unit pixel on the other end with the center of circle of the unit pixel in the middle is 120°;

the mask comprises a light-transmissive hole with a corresponding shape defined in a position of the pixel structure.

11. The mask according to claim 10, wherein a shape of the unit pixel is round; adjacent two unit pixels are externally-tangent.

12. The mask according to claim 10, wherein the subpixel is polygonal with arc corners, elliptic or round, and a shape of the unit pixel is round; adjacent two unit pixels are externally-tangent; the scan lines and the data lines are matched with a contour curve of the pixel; the display panel comprises a color filter substrate and an array substrate, the pixel structure comprises a color filter film located at the color filter substrate, edges of the color filter film at least comprise an arc section.

* * * * *